US008405287B2

(12) United States Patent
Okamura

(10) Patent No.: US 8,405,287 B2
(45) Date of Patent: Mar. 26, 2013

(54) LAMINATED PIEZOELECTRIC ELEMENT, INJECTION DEVICE HAVING THE ELEMENT, AND FUEL INJECTION SYSTEM

(75) Inventor: Takeshi Okamura, Kirishima (JP)

(73) Assignee: Kyocera Corporation, Kyoto (JP)

( * ) Notice: Subject to any disclaimer, the term of this patent is extended or adjusted under 35 U.S.C. 154(b) by 439 days.

(21) Appl. No.: 12/744,900

(22) PCT Filed: Nov. 28, 2008

(86) PCT No.: PCT/JP2008/071648

§ 371 (c)(1), (2), (4) Date: Sep. 10, 2010

(87) PCT Pub. No.: WO2009/069746

PCT Pub. Date: Jun. 4, 2009

(65) Prior Publication Data

US 2010/0320284 A1 Dec. 23, 2010

(30) Foreign Application Priority Data

Nov. 28, 2007 (JP) ................................ 2007-308082

(51) Int. Cl.
*H01L 41/083* (2006.01)

(52) U.S. Cl. ........................................ 310/366; 310/328

(58) Field of Classification Search .................. 310/328, 310/366

See application file for complete search history.

(56) References Cited

U.S. PATENT DOCUMENTS 3,489,931 A * 1/1970 Teaford ......................... 310/331
5,245,734 A * 9/1993 Issartel ......................... 29/25.35
7,633,210 B2 * 12/2009 Ono et al. ..................... 310/328
7,705,525 B2 * 4/2010 Kondo et al. ................. 310/366
8,106,565 B2 * 1/2012 Kastl et al. ..................... 310/328
2004/0255443 A1 12/2004 Iwase et al. .................. 29/25.35
2006/0238073 A1 10/2006 Ragossnig et al. ............ 310/328
2008/0224572 A1 * 9/2008 Dollgast et al. ............... 310/366
2010/0026144 A1 * 2/2010 Kastl et al. ..................... 310/366
2010/0194247 A1 * 8/2010 Dollgast et al. ............... 310/366
2010/0282874 A1 * 11/2010 Nakamura et al. ......... 239/585.1
2010/0288849 A1 * 11/2010 Okamura .................. 239/102.2
2010/0294853 A1 * 11/2010 Okamura .................. 239/102.2
2010/0325854 A1 * 12/2010 Reichinger .................. 29/25.35

FOREIGN PATENT DOCUMENTS

JP 2004-363190 12/2004
JP 2006-518934 8/2006

* cited by examiner

*Primary Examiner* — Thomas Dougherty
(74) *Attorney, Agent, or Firm* — DLA Piper LLP (US)

(57) ABSTRACT

This aims to provide a multi-layer piezoelectric element, which is made excellent in durability and suppressed in the reduction of a displacement degree, even if the element is largely displaced or driven at a high speed, and an injection device and a fuel injection system using the element. The multi-layer piezoelectric element comprises a stacked body comprising a plurality of ceramic layers and a plurality of internal electrode layers, each of the plurality of internal electrode layers being sandwiched between ceramic layers of the plurality of ceramic layers that are located opposite to each other. The plurality of ceramic layers comprises a plurality of piezoelectric layers, and a low-rigidity ceramic layer which has a rigidity lower than that of the plurality of piezoelectric layers and that of the plurality of internal electrode layers. The low-rigidity ceramic layer comprises a plurality of ceramic portions which are apart from each other via a void, and a covering layer which covers at least a part of an outer surface of the plurality of ceramic portions.

19 Claims, 10 Drawing Sheets

LAMINATED PIEZOELECTRIC ELEMENT, INJECTION DEVICE HAVING THE ELEMENT, AND FUEL INJECTION SYSTEM

CROSS-REFERENCE TO THE RELATED APPLICATIONS

This application is a national stage of international application No. PCT/JP20081071648, filed on Nov. 28, 2008 and claims the benefit of priority under 35 USC 119 to Japanese Patent Application No. 2007-308082 filed Nov. 28, 2007, the entire contents of which are incorporated herein by reference.

TECHNICAL FIELD

The present invention relates to a multi-layer piezoelectric element used for, for example, a driver element (piezoelectric actuator), a sensor element and a circuit element. As a driver element, for example, the fuel injector of an automobile engine, a liquid injection device like an ink jet, and the precise position arrangement equipment and the vibration control equipment like an optical device are mentioned. As a sensor element, for example, a combustion pressure sensor, a knock sensor, an acceleration sensor, a load sensor, an ultrasonic sensor, a pressure-sensitive sensor, and a yaw rate sensor are mentioned. In addition, as a circuit element, for example, a piezo-electric gyroscope, a piezo-electric switch, a piezoelectric transformer, and a piezo-electric breaker are mentioned.

RELATED ART

Conventionally, the multi-layer piezoelectric element becomes smaller and is required to undergo a greater amount of displacement under a higher pressure. Thus, it is required for the multi-layer piezoelectric element to be operated under a severe condition wherein an electric field of higher intensity is applied and the operation is continued over a longer of time period.

Unlike the usual multi-layer electronic parts, such as a capacitor, the multi-layer piezoelectric element itself causes a continuous dimensional change when it is driven. Accordingly, all the piezoelectric layers are tightly bonded and driven as a whole, thereby the multi-layer piezoelectric element is greatly driven to deform as a unit. Therefore, a large stress is applied to the element.

As one of the means to solve the above-mentioned problem, a multi-layer piezoelectric element, to which a porous ceramic layer is preliminarily disposed between the porous layers as a target breach layer (Patent Document 1). [Patent documents 1] Japanese Unexamined Patent Publication (Kokai) No. 2006-518934

PROBLEMS TO BE SOLVED BY THE INVENTION

As shown in Patent Document 1, it is capable to relax the stress which is applied to the piezoelectric layer to some extent by causing the multi-layer piezoelectric element to fracture at the target breach layer. It is because the stress applied to the piezoelectric layer or the internal electrode layer is relaxed by fracturing the ceramics which constitute the target breach layer. However, it is required for the multi-layer piezoelectric element to provide high response speed and higher amount of displacement.

In the case where the element is displaced in a large amount or at a high speed, the ceramics which constitutes the target breach layer would be fractured, thereby broken pieces of the ceramics are formed. Then, such broken pieces of the ceramics may cause the piezoelectric layer to be damaged, thereby the amount of displacement of the element may be decreased.

The present invention has been devised to solve the above problems. That is, an object of the present invention is to provide a multi-layer piezoelectric element, which contributes to avoid decrease of the amount of the displacement and is excellent in durability even in the cases where the element is displaced in a large amount or at a high speed, and an injection apparatus and a fuel injection system, each of which uses the above element.

MEANS FOR SOLVING THE PROBLEMS

The multi-layer piezoelectric element of a the present invention has a stacked body comprising a plurality of ceramic layers and a plurality of internal electrode layers, wherein each of the plurality of internal electrode layers is sandwiched between ceramic layers of the plurality of ceramic layers that are located opposite to each other, wherein the plurality of ceramic layers comprises a plurality of piezoelectric layers, and a low-rigidity ceramic layer which has a rigidity lower than that of the plurality of piezoelectric layers and that of the plurality of internal electrode layers, and wherein each of the low-rigidity ceramic layer comprises a plurality of ceramic portions which are apart from each other via a void, and a covering layer which covers at least a part of an outer surface of the plurality of ceramic portions.

EFFECT OF THE INVENTION

According to the multi-layer piezoelectric element of the present invention, it is capable to attain a high durability because the reasons as follows. One reason is that the low-rigidity ceramic layer comprises a plurality of ceramic portions which are apart from each other via a void. The other reason is explained below. Specifically, a plurality of ceramic portions which are apart from each other via a void; thereby the rigidity of the low-rigidity ceramic layer is decreased. Thus, the low-rigidity ceramic layer is capable to absorb the stresses. As a result, it is capable to lower the concentrated application of the stresses to the electric layers and the internal electrode layers, so that the amount of the displacement of the multi-layer piezoelectric element can be lowered.

Furthermore, since at least a part of an outer surface of the plurality of ceramic portions are covered by the covering layer, the multi-layer piezoelectric element of the present invention can maintain the outstanding durability for a long period of time. Even if the ceramic portion fractures and the broken pieces of the ceramics are formed due to the stress relaxation, scattering of such broken pieces can be controlled since at least a part of an outer surface of the plurality of ceramic portions is covered by the covering layer. And it is because damage to the piezoelectric layer by the broken pieces can be controlled.

BRIEF DESCRIPTION OF REFERENCE NUMERALS

| | |
|---|---|
| 1 | Multi-layer piezoelectric element, |
| 3 | ceramic layer, |
| 5 | internal electrode layer, |
| 7 | stacked body, |
| 9 | external electrode, |
| 11 | piezoelectric crystal grains, |
| 13 | piezoelectric layer, |
| 15 | low-rigidity ceramic layer, |
| 17 | void, |
| 19 | ceramic portion, |
| 21 | covering layer, |
| 21a | covering layer, |
| 21b | covering layer, |
| 23 | current-carrying part, |
| 25 | injection apparatus, |
| 27 | injection hole, |
| 29 | storage container, |
| 31 | needle valve, |
| 33 | fuel path, |
| 35 | cylinder, |
| 37 | piston, |
| 39 | plate spring, |
| 41 | fuel injection system, |
| 43 | common rail, |
| 45 | pressure pump, |
| 47 | injection control unit, |
| 49 | fuel tank. |

DETAILED DESCRIPTION OF THE PREFERRED EMBODIMENTS

Figure 1:
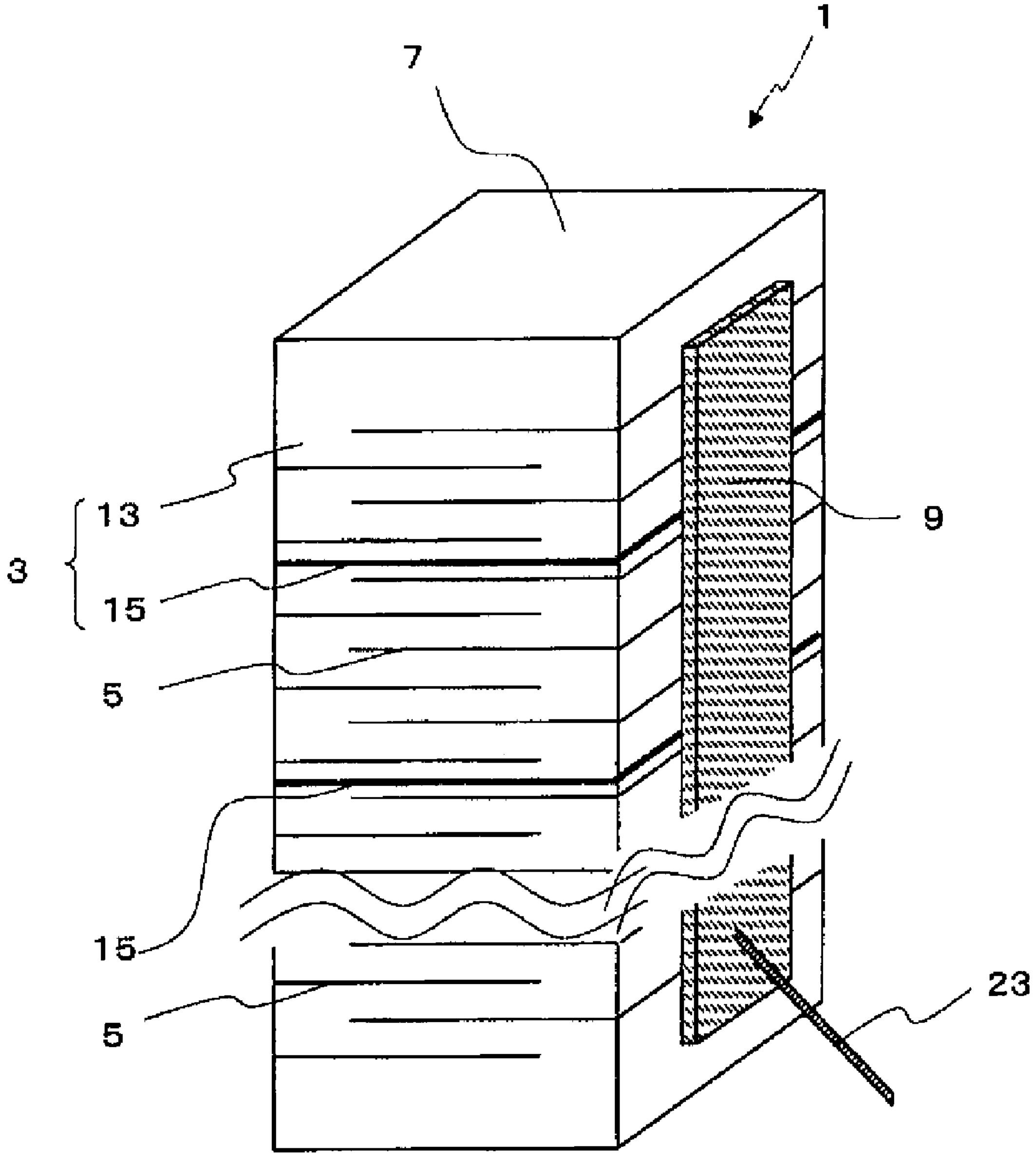
FIG. 1 is a perspective view showing an example of an embodiment of the multi-layer piezoelectric element of the present invention.
Figure 2:
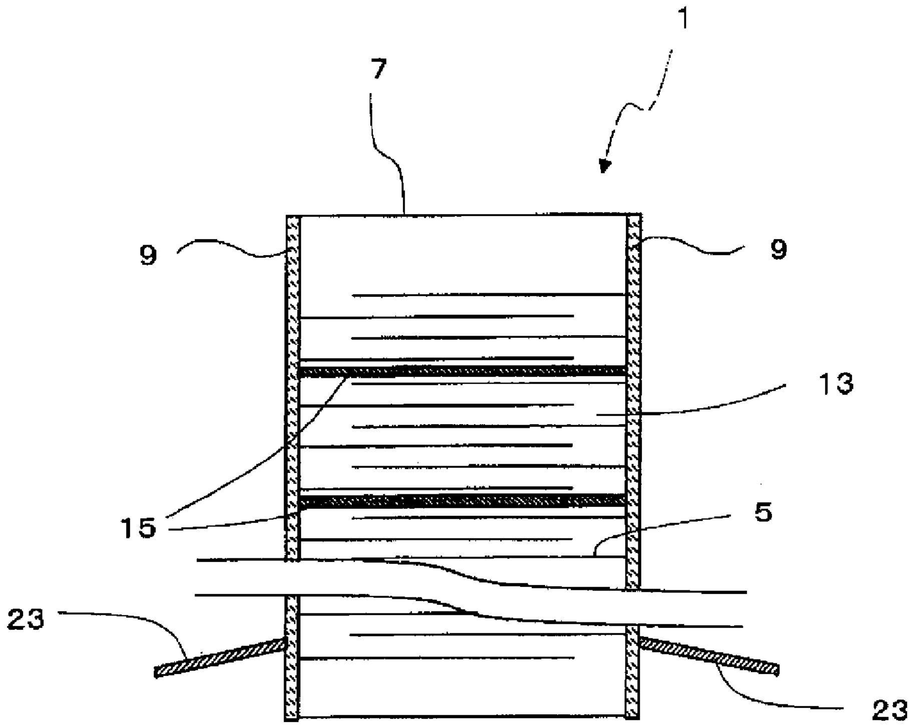
FIG. 2 is an example of the embodiment of the multi-layer piezoelectric element of the present invention, and shows a sectional view parallel to a laminating direction.
Figure 3:
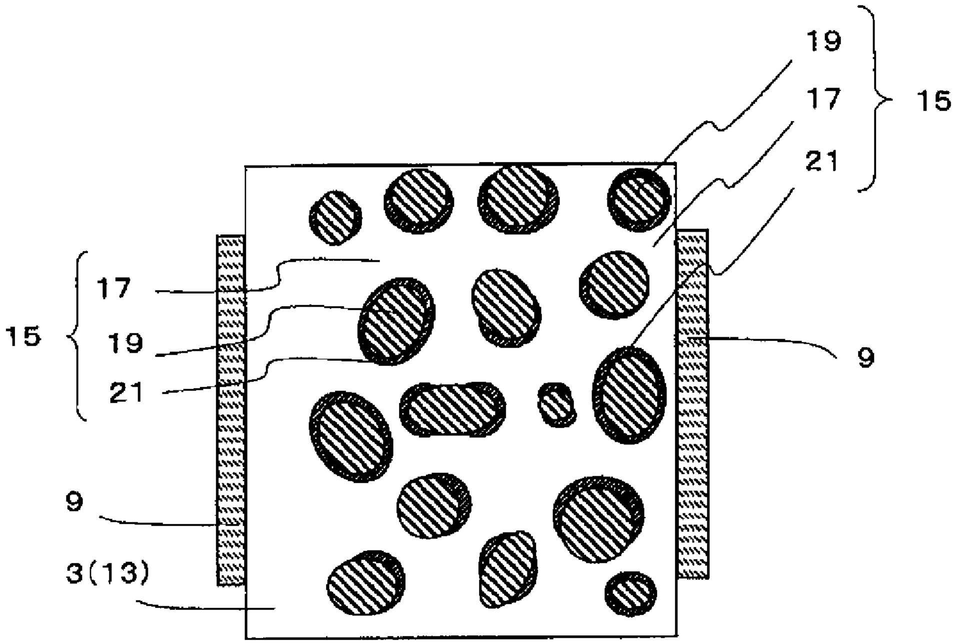
FIG. 3 is an example of the embodiment of the multi-layer piezoelectric element of the present invention, and shows a sectional view perpendicular to a laminating direction, which contains the low-rigidity ceramic layer.

Hereinafter, the multi-layer piezoelectric element of the present invention will be described in detail with reference to the accompanying drawings. FIG. 1 is a perspective view showing the multi-layer piezoelectric element relating to one embodiment of the present invention. FIG. 2 shows a sectional view of the multi-layer piezoelectric element as shown in FIG. 1, which is parallel to a laminating direction. FIG. 3 shows a sectional view of the multi-layer piezoelectric element as shown in FIG. 1, which is perpendicular to a laminating direction and which contains the low-rigidity ceramic layer.

As shown in FIGS. 1-3, the multi-layer piezoelectric element 1 (hereinafter, also merely referred to as "element 1") has a stacked body 7, which comprises a plurality of ceramic layers 3 and a plurality of internal electrode layers 5, wherein each of the plurality of internal electrode layers 5 is sandwiched between the plurality of ceramic layers 3 which are located opposite to each other, and external electrodes 9 formed on the side surfaces of the stacked body 7. Moreover, the plurality of ceramic layers 3 comprise a plurality of piezoelectric layers 13 and a low-rigidity ceramic layer 15 which has a lower rigidity compared with the plurality of piezoelectric layers 13 as well as the plurality of the internal electrode layers 5. The low-rigidity ceramic layer 15 is located between two piezoelectric layers 13.

In the present embodiment, the low-rigidity ceramic layer 15 means a layer having a bonding strength within the layers and/or the adjacent layers, which strength is weaker than that of the internal electrode layer 5 and the piezoelectric layer 13 and having a low rigidity. In addition, the low-rigidity ceramic layer 15 comprises a plurality of ceramic portions 19, which are apart from each other via a void 17, and a covering layer 21, which covers at least a part of an outer surface of the ceramic portion 19.

Since a plurality of the ceramic portions 19 are located apart from each other via a void 17, the low-rigidity ceramic layer 15 easily absorbs the stress. Therefore, even when the element 1 has been repeatedly elongated and contracted or a strong impact or a stress has been applied to the element 1 from outside, the stress can be absorbed by the ceramic portion 19 by deforming or fracturing of the ceramic portion 19. Thereby, the concentration of the stress on the internal electrode layer 5 or the piezoelectric layer 13 can be suppressed, thereby crack occurring in the internal electrode layer 5 or the piezoelectric layer 13 can be suppressed. As a result, it is possible to avoid the formation of an electric short circuit between the internal electrode layers 5 which are adjacently stacked in the stacking direction.

In particular, when the element 1 is driven under high electric field and high pressure, a strong stress is instantaneously applied to the element 1. Thus, it is difficult to predict in which direction a crack runs, and also difficult to stabilize the direction of the crack runs. On the other hand, a piezoelectric element, which makes it possible to be driven for further longer period of time under the condition having a high voltage and a high electric field. Thus, it is necessitated to make the stress applied to the element relaxed more effectively.

The rigidity of the internal electrode layer 5, the piezoelectric layer 13 and the low-rigidity ceramic layer 15 can be easily compared by applying load, for example, to the multi-layer piezoelectric element 1 in the direction vertical to a lamination direction. Specifically, it can be determined by applying load to the element in the direction perpendicular to the stacked direction according to the JIS three-point bending test (JIS R 1601). When the above test is performed, it is confirmed which part in the element 1 breaks. The fractured part is the part having the lowest rigidity in the element.

The multi-layer piezoelectric element 1 is equipped with the low-rigidity ceramic layers 15. Thus, when the JIS three point bending test is performed, a fracture will break out preferentially in this low-rigidity ceramic layers 15, or at the interface between the low-rigidity ceramic layers 15 and the piezoelectric layer 13 rather than in the internal electrode layer 5 and in the piezoelectric layer 13. Thus, the presence or absence of the low-rigidity ceramic layers 15 can be confirmed by checking whether the fractured part resides in the internal electrode layer 5 or in the piezoelectric layer 13, or in the low-rigidity ceramic layer 15 or at the interface between the low-rigidity ceramic layer 15 and the piezoelectric layer 13.

In addition, when the above JIS three-point bending test cannot be performed due to the matter that the test specimen size is too small, the test can be performed by preparing the test specimen having a rectangular column form from the element 1, placing the test specimen on two supporting points located apart at a predetermined distance and applying load to a midpoint between the two supporting points. As a result, the presence or absence of the low-rigidity ceramic layer 15 therein can be confirmed.

In addition, the phrase "having low rigidity" may be interpreted by the phrase having low Young's modulus. The Young's modulus can be determined, for example, by the nanoindentation method. For example, "Nanoindenter II" (available from Nano Instrument Inc.) can be used as the measuring apparatus. In a cross section perpendicular to or parallel to the stacked direction of the stacked body 7, the low-rigidity ceramic layer 15, the piezoelectric layer 13 and the internal electrode layer 5 is exposed and Young's modulus may be measured using the above measuring apparatus.

Figure 4:
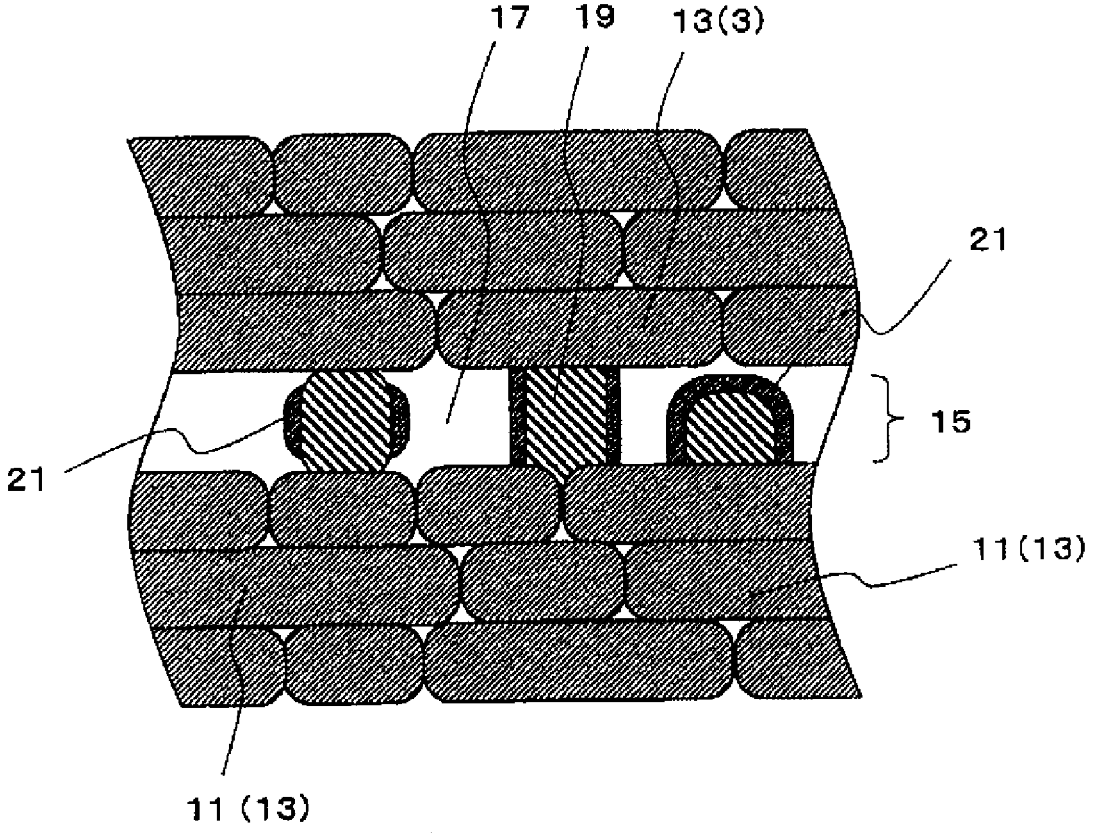
FIG. 4 is an expanded sectional view which expanded the low-rigidity ceramic layer relating to the embodiment shown in FIG. 2.

FIG. 4 is a sectional view which expanded around the low-rigidity ceramic layer 15 relating to the embodiment shown in FIG. 2. As shown in FIG. 4, in the multi-layer piezoelectric element 1 of the present embodiment, at least a part of an outer surface of the ceramic portion 19 is covered by a covering layer 21. Therefore, even when the ceramic portion 19 fractures, scattering of the broken pieces of the ceramic portion 19 can be controlled, since the ceramic portion 19 is covered by the covering layer 21. Thereby, damage caused by the above-mentioned broken pieces of the piezoelectric crystal grains 11 which constitute the piezoelectric layer 13 can be controlled. Here, the outer surface of the ceramic portion 19 means the portion which resides in between each of the adjacent piezoelectric layers 13 and which is apart from the piezoelectric layer 13.

When a strong stress is temporarily applied to the element 1, the stress can be dissipated by peeling the covering layer 21 from the ceramic portion 19. Specifically, when the above-mentioned strong stress would be added to the element 1, the strong stress is added also to the interface between the covering layer 21 and the ceramic portion 19, thereby the covering layer 21 peels from the ceramic portion 19. When the stress added to the element 1 is relaxed by the low-rigidity ceramic layer 15, the crystal grains which constitute the ceramic portion 19 absorbs the stress by deforming by itself depending on the stress. At this occasion, the crystal grains which constitute the ceramic portion 19 generates heat by itself simultaneously with its deformation, thereby the portion where the stress had mostly concentrated locally comes to have an elevated temperature. Then, the crystal grains thermally expand, thereby a condition where cracks easily form among the crystal grains is caused. However, the ceramic portion 19 is covered by the covering layer 21. Thus, the largest deformation generates in the portion where the crystal grains contact with the covering layer 21 among the crystal grains which constitute the ceramic portion 19. Thus, the interface between the ceramic portion 19 and the covering layer 21 is locally heated, which leads that the heated covering layer 21 thermally expand and peel from the ceramic portion 19 without generating heat or the crack among the crystal grains which constitute the ceramic portion 19. Thereby, heat can be efficiently emitted outside from the ceramic portion 19. Therefore, it is capable to control the progress of a crack within the low-rigidity ceramic layer 15 and stabilize the drive of the element 1. Further, the generation of oxygen defect, which is caused by the self-heating, within the ceramic portion 19 can also be suppressed.

In addition, it is capable to disperse the stress by peeling the covering layer 21 from the ceramic portion 19, so that the stress applied to the internal electrode layer 5 and the piezoelectric layer 13 can also be decreased. Thereby, the generation of crack within the internal electrode layer 5 and the piezoelectric layer 13 is suppressed. As a result, it is capable to suppress the electric short circuit from occurring between the internal electrode layers 5 which are adjacently stacked in the stacking direction.

As explained above, in the present embodiment, the stress, which is generated within the multi-layer piezoelectric element 1, is relaxed by covering the ceramic portion 19 with the covering layer 21 in the low-rigidity ceramic layer 15. However, there are various forms in the preferable forms of the covering layer 21 which covers the ceramic portion 19 depending on the environment where the multi-layer piezoelectric element 1 is used.

For example, in the case where the multi-layer piezoelectric element 1 is used under both environments having an ordinary temperature and an elevated temperature, it is preferable that the ceramic portion 19 has at least one portion, which is exposed without being covered, on the outer surface thereof as shown in FIG. 4. Thus, the matter that at least a part of the outer surface of the ceramic portion 19 is exposed makes the durability of the multi-layer piezoelectric element 1 improved, even when the multi-layer piezoelectric element 1 is used both environments having an ordinary temperature and an elevated temperature. In the case where the multi-layer piezoelectric element 1 is used for the fuel injection apparatus of an automobile engine and so forth, the element is used in a condition where an elevated temperature is applied. Thus, the multi-layer piezoelectric element 1 thermally expands to a large extent as compared with the use in a condition at an ordinary temperature. Under such an environment, stress occurs between the ceramic portion 19 and the covering layer 21 due to the difference of the thermal expansion coefficient of the ceramic portion 19 and the covering layer 21.

However, since the whole outer surface of the ceramic portion 19 is not covered by the covering layer 21, but at least a part of outer surface of the ceramic portion 19 is exposed, the stress can be released through the exposed portion. Thereby, it is capable to suppress the forming of the broken pieces of the ceramic portion 19 and the generation of the crack within the covering layer 21, so that the durability of the multi-layer piezoelectric element 1 can be improved. When the element is used under the elevated temperature environment, where the element is thermally expanded greatly, such a form particularly becomes effective.

Figure 5A:
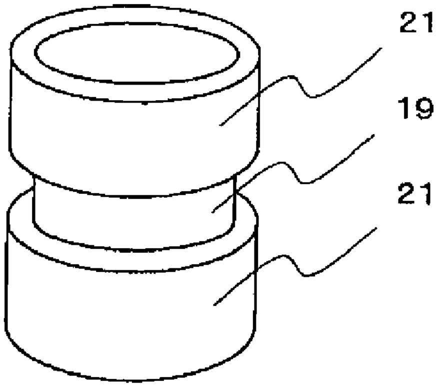
FIG. 5A is a perspective view showing an embodiment of the multi-layer piezoelectric element of the present invention.
Figure 5B:
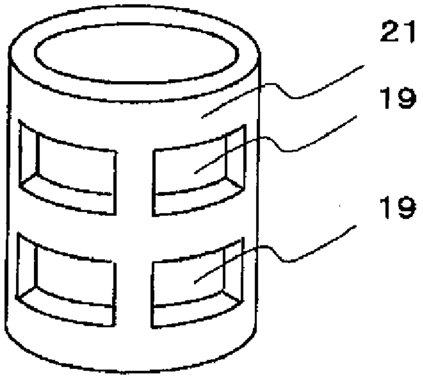
FIG. 5B is a perspective view showing an another embodiment of the multi-layer piezoelectric element of the present invention.

In the form where at least a part of the side surface of the ceramic portion 19 is exposed, following various forms can be adopted. Each of FIGS. 5A and 5B is a perspective view showing the ceramic portion 19 in the multi-layer piezoelectric element 1 in each of the other embodiments of the present invention. As shown in FIG. 5A, the ceramic portion 19 may have a form in which the outer surface thereof is covered by the covering layer 21 in a plurality, the covering layer 21 in the plurality being apart from each other. In this embodiment, the portion of the outer surface of the ceramic portion 19, which exposes between the covering layer 21 in a plurality being apart from each other, can easily deform, so that the ceramic portion 19 selectively deforms at this portion. As a result, the effect of stress relaxation on the multi-layer piezoelectric element 1 according to the ceramic portion 19 can be highly maintained.

In the case where the stress concentrates locally on a part of the outer surface of the ceramic portion 19, thereby the covering layer 21 at the corresponding part peels from the ceramic portion 19, the covering layer 21 which peels from the ceramic portion 19 can be limited to those merely cover the portions where the stress concentrated among the plurality of covering layers 21. Therefore, it is capable to suppress the covering layer 21 as a whole from peeling from the ceramic portion 19. As a result, the ceramic portion 19 can be stably covered by the covering layer 21.

Alternatively, for example, the covering layer 21 may have a form that the covering layer 21 is formed as one member being connected together and the surface of the ceramic portion 19 has a plurality of areas which are exposed and apart from each other. As shown in FIG. 5B, the outer surface of the ceramic portion 19 is covered by the covering layer 21 having the plurality of areas which are exposed and apart from each other, thereby the covering layer 21 can easily deform. Therefore, in the case where the element 1 is driven by applying a voltage, the covering layer 21 can easily follow the expansion and contraction of the ceramic portion 19. As a result, the bonding property between the ceramic portion 19 and the covering layer 21 can be improved. Specifically, it is preferable that the covering layer 21 has a mesh shape, since it becomes easy to follow the expansion and contraction of the ceramic portion 19.

Figure 5C:
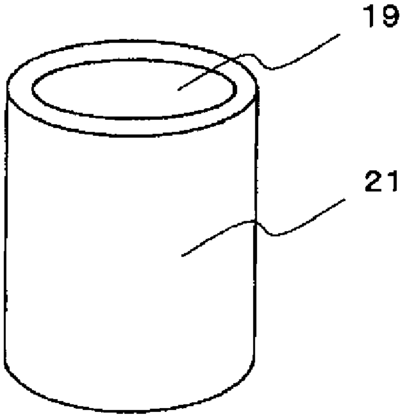
FIG. 5C is a perspective view showing an additional embodiment of the multi-layer piezoelectric element of the present invention.

In the case where the multi-layer piezoelectric element 1 is used under the atmosphere in which the ceramic portion 19 tends to easily deteriorate, it is preferable that a whole outer surface of the ceramic portion 19 is covered by the covering layer 21. As shown in FIG. 5C, exposure of the ceramic portion 19 can be suppressed when the whole outside of the ceramic portion 19 is covered by the covering layer 21. Thereby, the outer surface of the ceramic portion 19 can be prevented from being contacted with the ambient atmosphere, and the degradation of the ceramic portion 19 can be more surely suppressed. Particularly in the case where the multi-layer piezoelectric element is used in a condition having an atmosphere which easily degrades the ceramic portion 19, for example, where the ambient atmosphere contains so much moisture, the above-mentioned embodiment becomes effective.

It is preferable that at least a part of the covering layer 21 is bonded to the piezoelectric layer 13. In the case where the covering layer 21 is bonded to the piezoelectric layer 13, the stress applied to the ceramic portion 19 from the piezoelectric layer 13 accompanied by the driving of the multi-layer piezoelectric element 1 can be dispersed from the piezoelectric layer 13 to the covering layer 21. As a result, the durability of the ceramic portion 19 can be improved. In addition, the bonding property between the piezoelectric layer 13 and the low-rigidity ceramic layer 15 can be improved since the covering layer 21 is bonded to the piezoelectric layer 13.

Figure 6:
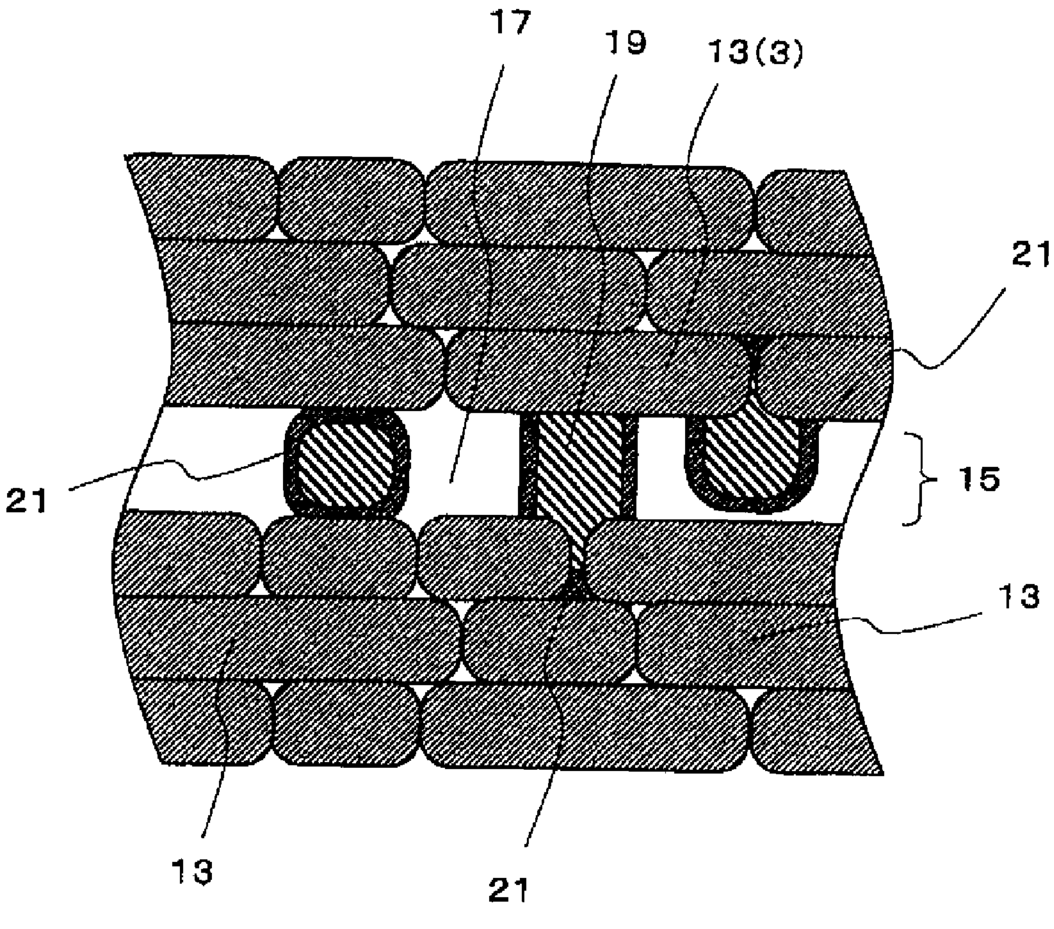
FIG. 6 is an expanded sectional view which expanded the portion in which the low-rigidity ceramic layer is formed in another embodiment of the multi-layer piezoelectric element of the present invention.

FIG. 6 shows the multi-layer piezoelectric element 1 relating to further more embodiment of the present invention, which expands the portion where the low-rigidity ceramic layers 15 is formed. As shown in FIG. 6, there are various forms in the forms of the ceramic portion 19 and the covering layer 21 which covers the ceramic portion. For example, in the case where the multi-layer piezoelectric element 1 is used under the environment in which relatively large stress would be applied to the multi-layer piezoelectric element 1, it is preferable that at least one of the plurality of the metal parts 19 is apart from the piezoelectric layer 13 and is bonded to the piezoelectric layer 13 via the covering layer 21 as shown FIG. 6. Even if a strong stress is locally applied to the interface between the low-rigidity ceramic layer 15 and the piezoelectric layer 13, the influence can be kept to damage the covering layer 21, and damaging to the ceramic portion 19 and the piezoelectric layer 13 can be suppressed. As a result, an effect of the stress relaxation due to the ceramic portion 19 can be improved, and the decrease in the displacement of the multi-layer piezoelectric element 1 may be suppressed.

In the case where the multi-layer piezoelectric element is used in a corrosion-prone environment, it is more preferable that the whole surface of the ceramic portion 19 is covered by the covering layer 21 as shown in FIG. 6. Since the whole surface of the ceramic portion 19 is covered by the covering layer 21, it is capable to prevent not only the outer surface of the ceramic portion 19, but also the surface other than the outer surface of the ceramic portion 19 from being contacted with the ambient atmosphere, even when the ceramic portion 19 is apart from the piezoelectric layer 3. In the case where the surface other than the outer surface of the ceramic portion 19 contacts with the ambient atmosphere, such as in the case where the ceramic layer 3 is constituted by the piezoelectric crystal grains 11, the above-mentioned form comes to be effective especially. Thereby, degradation of the ceramic portion 19 can be suppressed more surely.

Figure 7:
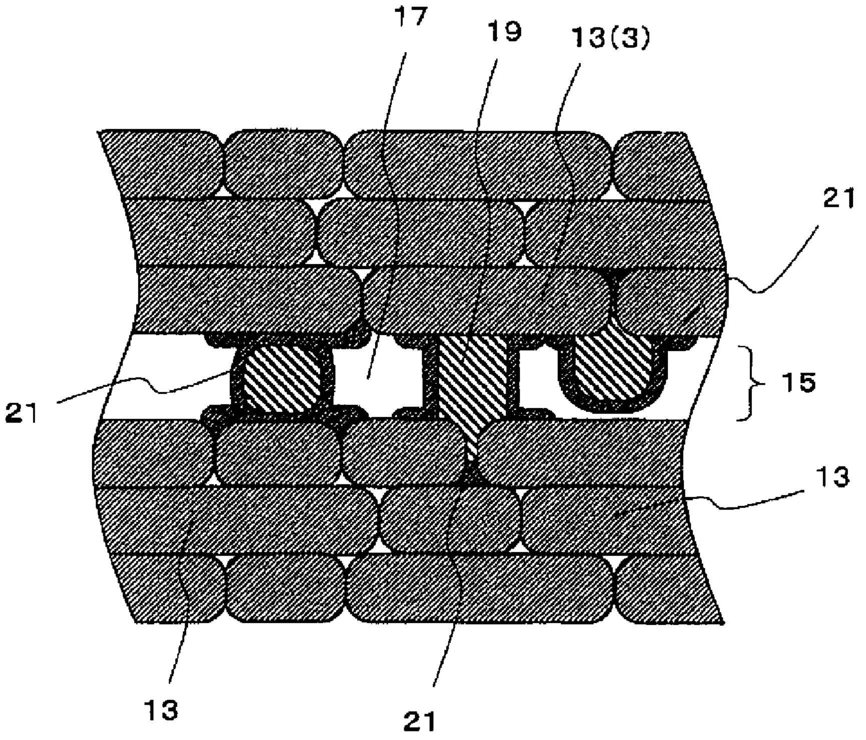
FIG. 7 is an expanded sectional view which expanded the portion in which the low-rigidity ceramic layer is formed in another embodiment of the multi-layer piezoelectric element of the present invention.

FIG. 7 shows the multi-layer piezoelectric element 1 relating to the other embodiment of the present invention, which expands the portion where the low-rigidity ceramic layer 15 is formed. As shown in FIG. 7, it is preferable that the covering layer 21 is formed not only at a part of the outer surface of the ceramic portion 19, but also at the surface which opposes to the low-rigidity ceramic layer 15 of the piezoelectric layer 13. Since the stress is concentrated on the low-rigidity ceramic layer 15, the low-rigidity ceramic layer 15 or around thereof locally comes to have an elevated temperature. Therefore, it is possible that the piezoelectric layer 13 which is adjacent to the low-rigidity ceramic layer 15 in the stacking direction may cause denaturation by prolonged use.

However, a surface of the piezoelectric layer 13 which is opposite to the low-rigidity ceramic layer 15 is covered by the extended covering layer 21, the influence due to the ambient atmosphere, such as the external air, can be made small. Accordingly, the denaturation of the piezoelectric layer 13 can be suppressed. Moreover, even if a part of piezoelectric layer 13 has been peeled and the broken pieces thereof have been formed, the coverage of the covering layer 21 can make the influence caused by the broken pieces small.

Figure 8:
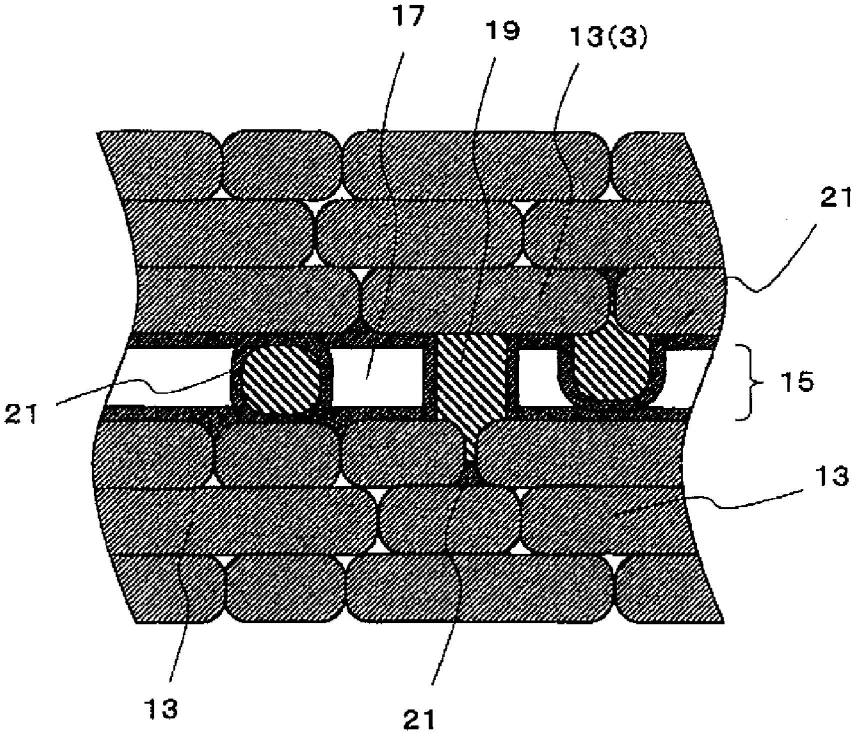
FIG. 8 is an expanded sectional view which expanded the portion in which the low-rigidity ceramic layer is formed in another embodiment of the multi-layer piezoelectric element of the present invention.

FIG. 8 shows the multi-layer piezoelectric element 1 relating to the other embodiment of the present invention, which expands the portion where the low-rigidity ceramic layer 15 is formed. As shown in FIG. 8, it is preferable that the whole surface of the piezoelectric layer 13, which opposes to the low-rigidity ceramic layer 15 is covered by the covering layer 21. Thereby, the possibility that an oxygen defect would formed in the piezoelectric layer 13 can be made smaller.

In addition, in the above-mentioned embodiment, the ceramic portion 19 comprises ceramics as a main component. The ceramic portion 19 may consist only of a ceramic component, or may contain components, such as metal and glass. The ceramic component includes a piezo electric crystal, such as lead zirconate titanate (PZT) or dielectric component such as an alumina.

In the case where each of the piezoelectric layer 13 and the ceramic portion 19 comprise oxide compounds as a main component, respectively, it becomes particularly effective that the ceramic portion 19 is covered by the covering layer 21. It is because the possibility that a crack may form in the piezoelectric layer 13 can be made smaller. This is based on the following reason.

Since the low-rigidity ceramic layer 15 absorbs the stress, the portion of the ceramic portion 19, which absorbs the stress generates heat, generates heat, thereby the portion locally comes to an elevated temperature. Thus, by becoming an elevated temperature locally, oxygen within the crystal structure which constitutes the ceramic portion 19 is lost, and oxygen vacancies are formed. In the case where the ceramic portion 19 is particularly exposed, a reduction reaction is promoted at the surface contact with the external air, thereby oxygen vacancies increase. Moreover, since the electric field is applied through the piezoelectric layer 13, the oxygen vacancies are ionized. Then, there is a case where the ionized oxygen vacancies are conducted to the positive electrode side through the piezoelectric layer 13, which is adjacent to the low-rigidity ceramic layer 15 by the driving electric field of the multi-layer piezoelectric element 1. By the conduction of these ionized oxygen vacancies, energizing paths of oxygen vacancies are formed inside of the piezoelectric layer 13. Such an energizing path has oxygen defects, which may cause the collapse of the crystal structure. Thus, it is capable that a portion which has decreased strength may partially form on the piezoelectric layer 13. Thus, since the strength of the piezoelectric layer 13 partially decreases due to the formation of the oxygen defects, it comes to be possible that a crack forms within the piezoelectric layer 13.

However, the development of the oxygen defect in the low-rigidity ceramic layer 15 can be suppressed by the ceramic portion 19, which is covered by the covering layer 21. As a result, the decrease of the strength of the piezoelectric layer 13 can be suppressed and the crack generation can be avoided.

In particular, in the case where the element 1 is used under a low pressure environment which is similar to vacuum, it is more preferable that the ceramic portion 19 is covered by the covering layer 21. It is because oxygen in the ambient atmosphere is insufficient under the low pressure environment, and a reductive reaction tends to be facilitated in the low-rigidity ceramic layer 15, which locally generates heat when it is driven, so that oxygen deficiency easily occurs in the piezoelectric layer 13.

As the covering layer 21, it is preferable to use a material which can suppress the ceramic portion 19 from deteriorating by the influence of the ambient atmosphere or the atmosphere in a service condition. For example, ceramics including alumina, resins or glasses can be used. When a resin is used for the covering layer, a driving distance of the multi-layer piezoelectric element can be increased, since such a covering layer can follow the expansion and contraction speed of the multi-layer piezoelectric element 1 when it is driven at a high speed due to having an excellent property in expansion and contraction. In addition, when a glass or alumina is used for the covering layer, such covering layer can stably suppress the deformation of the ceramic portion 19 due to having good bonding property with the ceramic portion 19 and the piezoelectric layer 13.

Particularly, it is preferable that the covering layer 21 contains a glass component (vitreous substance) as a main component. Since a glass component (vitreous substance) has a good bonding property with the ceramic portion 19, the bonding property between the ceramic portion 19 and the covering layer 21 can be improved by using a material containing the vitreous substance as its main component for the covering layer 21. In the case where the covering layer 21 is bonded to the piezoelectric layer 13 as shown above, the vitreous substance can also improve the bonding property between the piezoelectric layer 13 and the low-rigidity ceramic layer 15, since the vitreous substance has an excellent bonding property with the piezoelectric layer 13. Here, the term main component means that it is the component that has the largest value in % by mass unit among the contained components. In addition, what is necessary is just to use X-ray diffraction (XRD: X-Ray Diffraction) and a transmission electron microscope (TEM: Transmission Electron Microscope), in order to analyze an amorphous state peculiar to glass.

It is further preferable that the vitreous substance includes a silicon oxide as a main component thereof. It is not only because the silicon oxide forms a liquid phase with the main component of the ceramic portion 19 in the course of forming a multi-layer piezoelectric element 1 by calcination, thereby advancing the calcination, but also because a compatibility with the ceramic portion 19 can be improved. Thereby, the bonding property between the ceramic portion 19 and the covering layer 21 can be further improved.

It is also preferable that the covering layer 21 contains the same component as that of the main component of the ceramic portion 19. Since the covering layer 21 contains the same component as that of the main component of the ceramic portion 19, the main component of the ceramic portion 19 contained in the covering layer 21 bonds with the ceramic portion 19, so that a high anchor effect can be acquired. Thereby, the bonding property between the ceramic portion 19 and the covering layer 21 can be further improved.

It is still more preferable that the covering layer 21 contains the oxide compound of the main component of the ceramic portion 19. Since the covering layer 21 contains the oxide compound of the main component of the ceramic portion 19, the ceramic portion 19 bonds to the covering layer 21 by an ionic bonding, which has larger bonding strength than a metallic bonding, thereby the bonding property of the covering layer 21 with the ceramic portion 19 can be further improved.

Moreover, when the ceramic portion 19 uses PZT as a principal component, it is effective to use oxide ceramics including alumina as the covering layer 21. It is because the ceramic portion 19 and the covering layer 21 are both oxide ceramics, so the bonding property of the ceramic portion 19 with the covering layer 21 can be improved.

Figure 9:
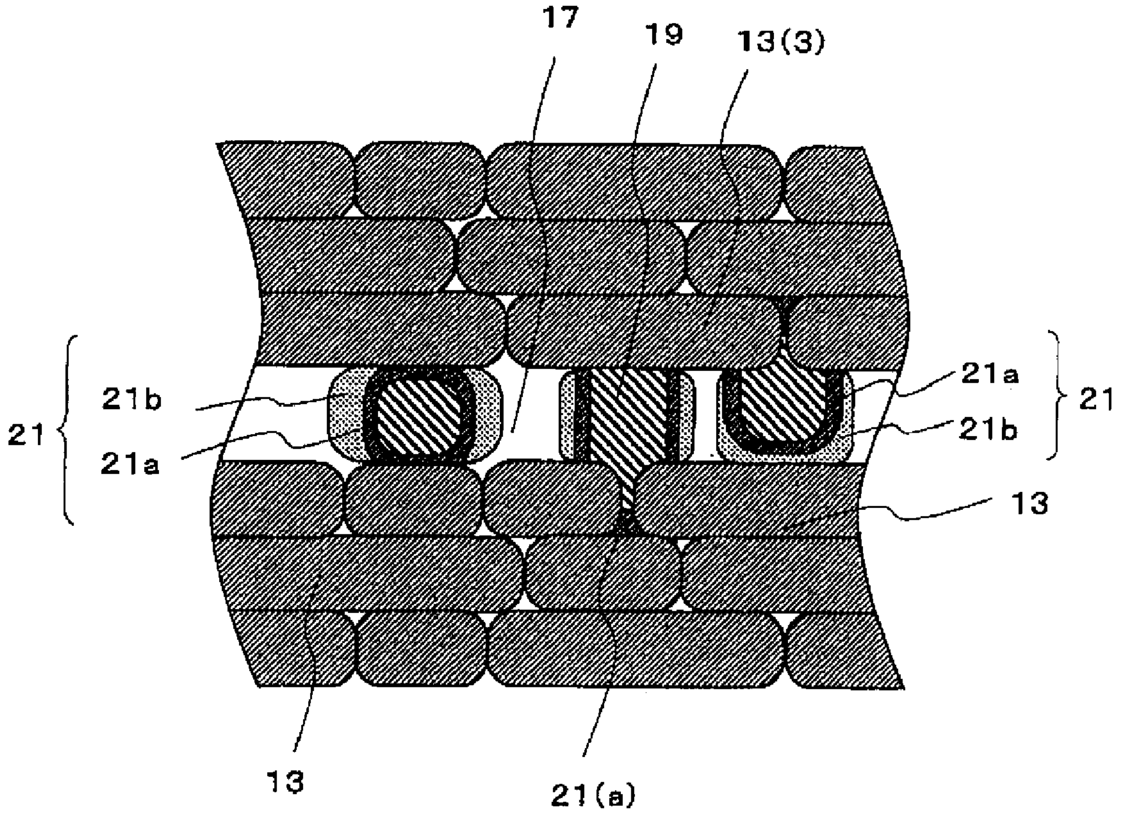
FIG. 9 is an expanded sectional view which expanded the portion in which the low-rigidity ceramic layer is formed in another embodiment of the multi-layer piezoelectric element of the present invention.
Figure 10:
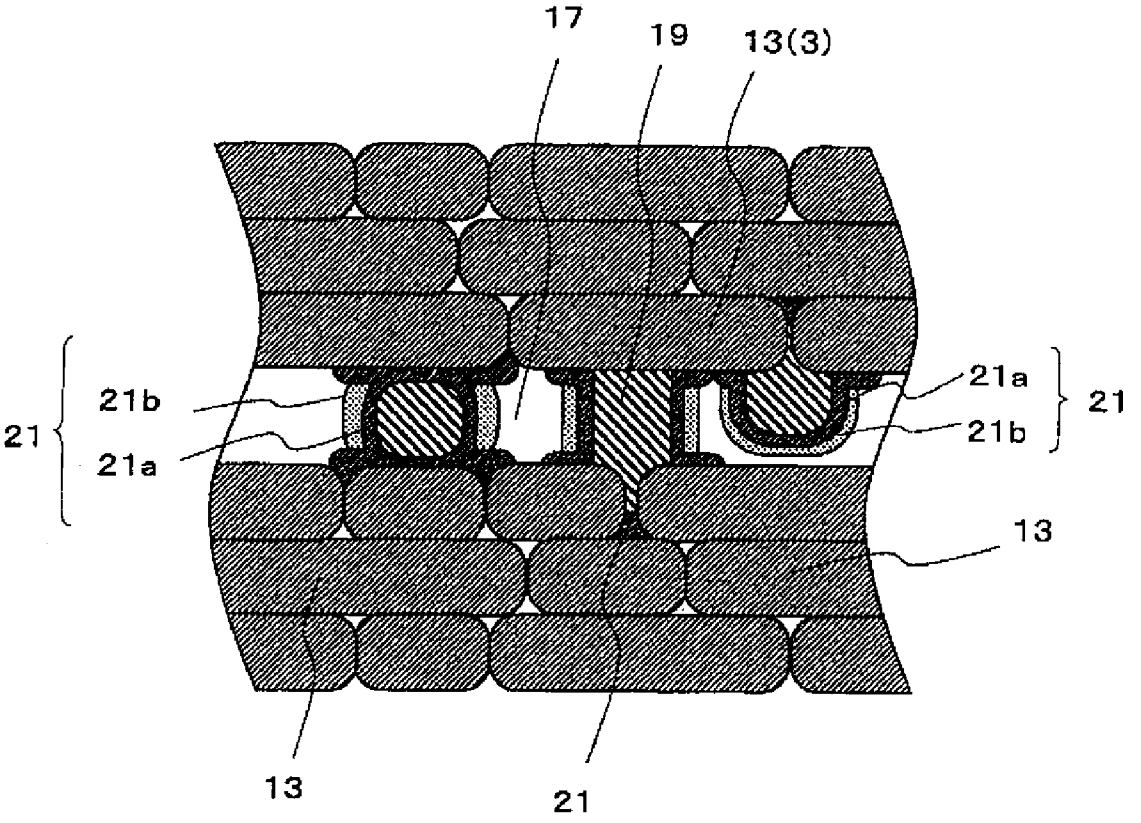
FIG. 10 is an expanded sectional view which expanded the portion in which the low-rigidity ceramic layer is formed in another embodiment of the multi-layer piezoelectric element of the present invention.

Each of FIGS. 9 and 10 is an expanded sectional view which expanded the portion in which the low-rigidity ceramic layer 15 of the multi-layer piezoelectric element 1 is formed in another embodiment of the present invention. As shown in FIGS. 9 and 10, it is preferable that the covering layer 21 comprises two or more layers. In the case where a crack occurs in any one of the layers of the laminated layers, the propagation of the crack can be remained only in the above-mentioned layers, since the covering layers 21 consists of a plurality of laminated layers. Therefore, propagation of the crack can be terminated within the plurality of the covering layers 21, thereby propagation of the crack toward the other layers can be suppressed. Thereby, it can be suppressed that the covering layer 21 as a whole is influenced by the cracking. Specifically, a material selected from the above-mentioned glass, ceramic and so forth may be used as the inner covering layer 21*a* and a material selected from a resin can be used as the outer covering layer 21*b*.

Further, as shown in FIG. 10, in addition to that the covering layer 21 consists of two or more layers, it is preferable that the surface of the piezoelectric layer 13, which opposes to the low-rigidity ceramic layer 15 is also covered by the covering layer 21.

It is more preferable that the covering layer 21 furthermore consists of several layers, wherein the content of the main component of the ceramic portion 19 in each layer differs from each other. When the covering layer 21 contains the main component of the ceramic portion 19, the thermal expansion coefficient of the covering layer 21 can be brought close to that of the ceramic portion 19. When the covering layer 21 consists of several layers as mentioned above, the thermal expansion coefficient in the covering layer 21 can be gradually brought close to the thermal expansion coefficient of the ceramic portion 19. Therefore, the stress, which is possibly produced according to the difference of the thermal expansions between the covering layer 21 and the ceramic portion 19, can be relaxed.

It is preferable that the covering layer 21 consists of several layers each having a modulus of elasticity different from each other. In the case where the covering layer 21 consists of several layers each having a modulus of elasticity different from each other, the modulus of elasticity in the covering layer 21 can be gradually brought close to the modulus of elasticity of the ceramic portion 19. Therefore, the stress produced according to expansion and contraction between the covering layer 21 and the ceramic portion 19 can be relaxed. As a result, the peeling of the covering layer 21 from the ceramic portion 19 can be suppressed, and generating of the crack in the ceramic portion 19 or the covering layer 21 can be suppressed.

Particularly, it is preferable that a material comprising a glass, such as silica is used as the material of the covering layer 21*a* that contacts with the ceramic portion 19, and a material comprising a resin is used as the material of the covering layer 21*b* which is formed thereon. It is because the covering layer 21 can have an excellent expansion and contraction performance peculiar to resin together with an outstanding adhesion property peculiar to glass. Moreover, even when a stress, which possibly cause a crack, is added to the inner covering layer 21*a* comprising the glass from inside thereof, the propagation of the crack in the covering layer 21*a* is suppressed by the outer covering layer 21*b* having an elasticity, which comprises the resin, and the propagation of the crack to the covering layer 21*b* is also suppressed.

Next, the method for manufacturing the multi-layer piezoelectric element 1 in the present embodiment will be explained.

First, a ceramic green sheet to be the piezoelectric layer 13 is produced. Specifically, a calcined powder of the piezoelectric ceramic, a binder comprising an organic polymer based on an acrylic type or a butyral type and a plasticizer are mixed to form a slurry. Then, the slurry is subjected to a known tape molding methods including such as a doctor blade method or a calender roll method, thereby a ceramic green sheet is produced. As such piezoelectric ceramic, a material having the piezoelectric property, for example, a perovskite oxide such as $PbZrO_3$—$PbTiO_3$ may be used. As such plasticizer, DBP (dibutyl phthalate), DOP (dioctyl phthalate) and so forth can be used.

Next, the conductive paste used for the internal electrode layer 5 is produced. Specifically, the electro-conductive paste is produced by adding a binder and a plasticizer and so forth to a metal powder comprising such as silver-palladium and mixing them together. The piezoelectric layer 13 and the internal electrode layer 5 can be formed by applying the above electro-conductive paste onto the above ceramic green sheet using the screen printing method, and calcining explained as follows.

The low-rigidity ceramic layer 15 can be formed by using a slurry to which binders were added in an amount higher than the content thereof in the slurry for producing the piezoelectric layer 13 or a slurry which was prepared by adding acrylic beads to the slurry for producing the piezoelectric layer 13. After the above-mentioned slurry for producing the low-rigidity ceramic layer 15 is applied onto the ceramic green sheet through the screen printing method, the sheet is subjected to a calcination process or a degrease process, through which process the scattering component such as the binders and the acrylic beads scatters. Thus, a plurality of the ceramic portions 19, which are located apart from each other via a void 17, can be produced.

The method of forming the ceramic portion 19, which are located apart from each other via a void 17, is not restricted to the above-mentioned method. For example, the above-mentioned ceramic portion 19 can be also formed by changing the mesh size or the pattern of a mesh of the screen. Specifically, when a screen having a mesh size of 15 μm or less is used, the amount of the ink paste, which passes through the screen is insufficient. Thus the ink has been printed in a mottled pattern, so that the ceramic portions 19, which are located apart from each other via a void 17, can be produced.

When a masking which does not allow the ink paste to pass through the screen is adopted, the condition where the ink paste insufficiently passes through is resulted as similar to the above. Therefore, the ceramic portion 19, which are located apart from each other via a void 17, can be produced. The shape of the masking is preferable to have almost circular shape, such as an ellipse or a circle, since such a shape has an improved effect to relax the stress.

As a method of forming the covering layer 21 which covers at least a part of the outer surface of the ceramic portion 19, the following method can be adopted. As a first method, a method of laminating a ceramic green sheet and a conductive paste to form a laminate, calcining the laminate to form a stacked body 7, and immersing the stacked body in a solution having the components of the covering layer 21 may be mentioned. Thus, the surface of the ceramic portion 19 can be covered by the covering layer 21 by immersing the stacked body 7 in the solution having the components of the covering layer 21, thereafter pulling it up. At this time, after the stacked body is immersed in a container, the gases such as air existing within the voids 17 in the low-rigidity ceramic layer 15 can be discharged by degassing the container with using a vacuum pump such as a rotary pump. Thus, the components of the covering layer 21 can be prevailed. Thereafter, the pressure is returned to an atmospheric pressure from a vacuum, the element 1 is heated, thereby merely the solvent is evaporated from the solution, so that the covering layer 21 having voids 17 therein can be obtained.

As the solution for the components of the covering layer 21, an aqueous dispersion (solution) in which tetra-ethoxy silane (TEOS) or colloidal silica is dispersed in water can be used. In this case, the covering layer 21 can be formed with the covering layer 21 made of a vitreous substance, which mainly consists of an oxide of silicon (Si). Alternatively, the covering layer 21 comprising a resin can be produced by using a solution which was made by diluting a resin of an epoxy system or a silicone system with a solvent selected from acetone, ether, chloroform or thinner for industrial use and so forth.

As the second method, a method in which the component for forming the covering layer 21 is added beforehand to the ceramic green sheet, which forms the low-rigidity ceramic layer 15, is mentioned. A plurality of stacked bodies 7 where two or more piezoelectric layers 13 and two or more internal electrode layers 5 are laminated one on another are laminated via the ceramic green sheet, thereafter the stacked body is calcined. In particular, when a forming method wherein the ceramic green sheet serving as the low-rigidity ceramic layer 15 is used as the bonding member, the step comprising immersing the stacked body 7 in the solution of the component of the above-mentioned covering layer 21 and pulling up from the solution is not required. Thus, production cost can be reduced.

In addition, without being limited to the method as described above, the stacked body 7 can be produced by any method as long as it can produce the stacked body wherein a plurality of piezoelectric layers 3 and a plurality of internal electrode layers 5 are stacked alternately one on another.

Thereafter, the external electrode 9 is formed so that the external electrode can be electrically connected with the piezoelectric layer 13, which has an end portion exposed on the outer surface of the multi-layer piezoelectric element 1. Such an external electrode 9 can be obtained by adding a binder to a glass powder to produce a silver-glass electroconductive paste, thereafter the paste being printed and dried or burnt.

Next, the stacked body in which the external electrode 9 was formed is immersed in a resin solution containing the exterior resin comprising silicone rubber. Then, the silicone resin solution is vacuum degassed, thereby the silicone resin is firmly adhered onto the uneven outer surface of the outer surface of the stacked body 7. Thereafter, the stacked body 7 is pulled up from the silicone resin solution. Thus the side surface of the stacked body 7 is coated with the silicone resin (not shown). Then, a lead is connected to the external electrode 9 with an electro-conductive adhesive (not shown) and so forth as the current-carrying part 23.

A DC voltage of 0.1 to 3 kV/mm is applied across a pair of external electrodes 9 via the lead wires so as to apply a polarization treatment to the stacked body 7, thereby the multi-layer piezoelectric element 1 of the present embodiment is obtained. The lead wires are connected to an external voltage source (not shown) that supplies the voltage via the lead wires as the current-carrying part 23 and the external electrodes 9 to the piezoelectric layers 13, so that each of the piezoelectric layers 13 undergoes significant displacement due to a reverse piezoelectric effect. Thus, the device is capable to function as, for example, an automobile fuel injection valve that injects fuel to an engine of an automobile.

The above embodiment explained the embodiment wherein the low-rigidity ceramic layer 15 is sandwiched between the piezoelectric layers 13 and both surfaces of the low-rigidity ceramic layer 15 contacts with each of the piezoelectric layers 13. However, without being limited to the method as described above, the present invention may adopt the embodiments wherein the low-rigidity ceramic layer 15 is sandwiched between the piezoelectric layer 13 and the internal electrode layer 5 and one surface of the low-rigidity ceramic layer 15 contacts with the piezoelectric layers 13, or the low-rigidity ceramic layer 15 is sandwiched between the internal electrode layers 5.

Figure 11:
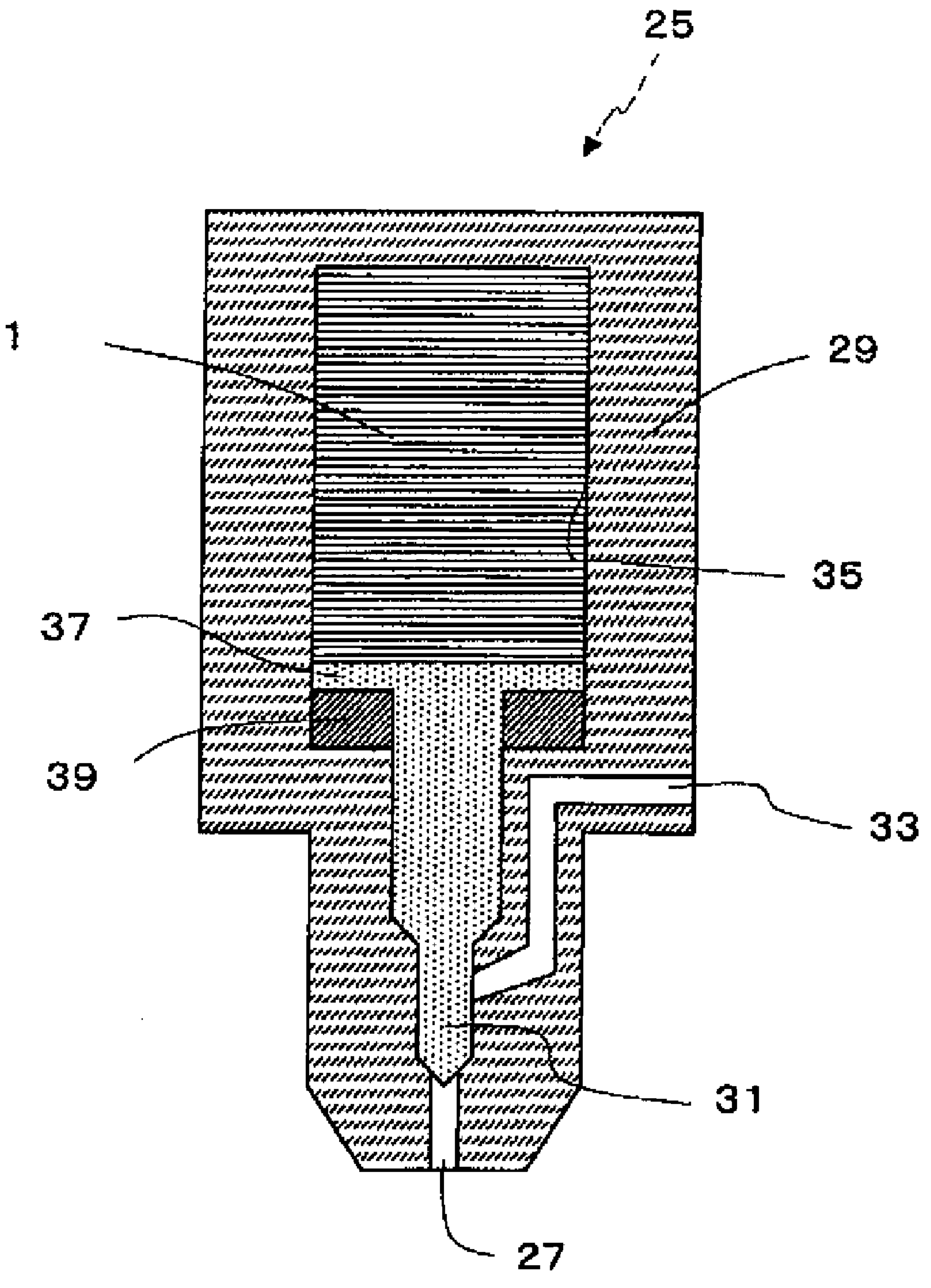
FIG. 11 is a sectional view showing the fuel injection apparatus of the present invention.

Then, the fuel injection apparatus of the present invention is explained. FIG. 11 is a schematic sectional view showing the fuel injection apparatus 25 in one embodiment of the present invention. As shown in FIG. 11, the fuel injection apparatus 25 in the present embodiment comprises a storage container 29 having an injection hole 27 at one end, and the multi-layer piezoelectric element 1 being accommodated in the storage container, which is represented by the above embodiment. A needle valve 31 that can open and close the injection hole 27 is housed in the storage container 29. The injection hole 27 is connected to a fuel passage 33 disposed so as to be capable of making communication with the movement of the needle valve 31. The fuel passage 33 is connected to a fuel source that is provided outside of the apparatus, so as to receive supply of the fuel at a high pressure that remains always constant. Therefore, when the needle valve 31 opens the injection hole 27, the fuel that fills the fuel passage 33 is injected at a predetermined level of high pressure into a fuel chamber of an internal combustion engine that is not shown in the drawings.

The needle valve 31 has an enlarged top portion having a larger diameter, onto which a piston 37 that makes a sliding motion in a cylinder 35 that is formed in the storage container 29 is attached. The multi-layer piezoelectric element 1 described above is housed in the storage container 29.

With the injection apparatus 25 as described above, when the multi-layer piezoelectric element 1 is caused to expand by a voltage application thereto, the piston 37 is pressed so that the needle valve 31 plugs the injection hole 27 and shuts off the fuel supply. When voltage application is stopped, the multi-layer piezoelectric element 1 contracts and a plate spring 39 presses back the piston 37 so that the injection hole 27 communicates with the fuel passage 33, thereby allowing the fuel to be injected.

Moreover, the injection apparatus 25 of the present embodiment may be constructed so that it comprises a container having an injection hole 27 and the multi-layer piezoelectric element 1, wherein a liquid filled in the container is injected through the injection hole 27 by the actuation of the multi-layer piezoelectric element 1. That is, the multi-layer piezoelectric element 1 is not necessarily be located in the container, but is sufficient that the apparatus has a construction that a pressure may be generated within the container by the drive of the multi-layer piezoelectric element 1. In addition, in the present embodiment, the term liquid includes a fuel, an ink and various fluid in the form of liquid such as a conductive paste.

Figure 12:
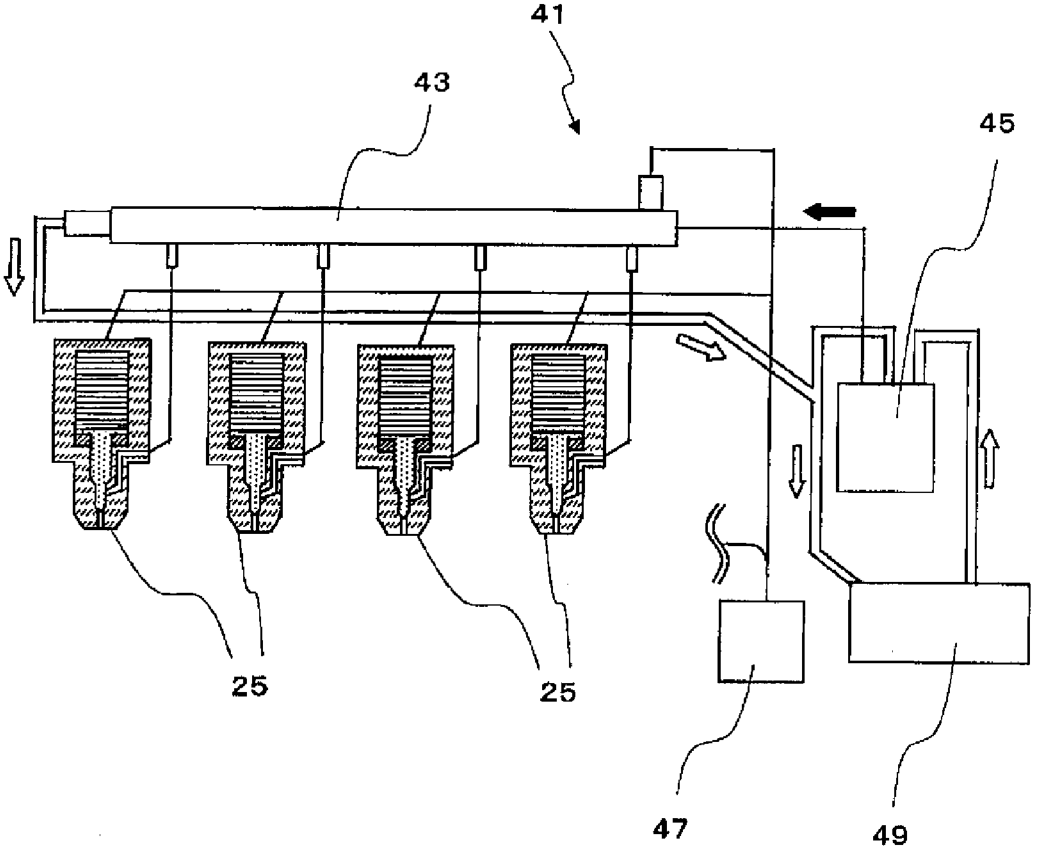
FIG. 12 is a schematic diagram showing the fuel injection system relating to one embodiment of the present invention.

Then, a fuel injection system 41 according to an embodiment of the present invention is explained. FIG. 12 is a schematic diagram showing the fuel injection system 41 of one embodiment of the present invention. As shown in FIG. 12, the injection system 41 of the present invention comprises a common rail 43 that contains a fuel stored at a high pressure, a plurality of injection apparatuses 25 as described in the above which can inject the fuel stored in the common rail 43, a pressure pump 45 which supplies the fuel to the common rail 43 at a high pressure and an injection control unit 47 that supplies a drive signal to the injection apparatus 25.

The injection control unit 47 controls the quantity of the fuel to be injected and the timing of the injection, while monitoring the condition in the engine with a sensor. The pressure pump 45 plays the role which supplies the fuels to the common-rail 43 at a pressure of about 1000-2000 atm (about 101 MPa to about 203 MPa), preferably about 1500-1700 atm (about 152 MPa to about 172 MPa). The common rail 43 stores the fuel sent from the pressure pump 45 and sends it to the injection apparatus 25 as required. The injection apparatus 25 injects a small amount of fuel by spraying through the injection hole 27 into the combustion chamber.

The present invention is not limited to the embodiments described above. Various modifications may be made to the present invention without departing from its scope. Moreover, the present invention relates to a multi-layer piezoelectric element, an injection device and an fuel injection system, however the present invention is not limited to the above-mentioned embodiments, but can be performed with an element which utilizes the piezoelectric property.

EXAMPLES

Example 1

The multi-layer piezoelectric element 1 of the present invention was produced as follows.

First, a raw material powder of lead zirconate titanate (PZT) having an average particle size of 0.4 μm as the main component, a binder and a plasticizer were mixed to form a slurry, which was applied by a doctor blade process to form a ceramic green sheet having a thickness of about 150 μm.

Then, an electro-conductive paste, which was obtained by adding a binder to the raw material powder containing a silver-palladium alloy powder having the metal composition comprising 95% by weight of Ag and 5% by weight of Pd, was prepared.

In addition, a raw material powder of lead zirconate titanate (PZT) having an average particle size of 0.8 μm as the main component, a binder, an acrylic beads having an average particle size of 1 μm and a plasticizer were mixed to form a slurry, thereby a ceramic paste was prepared.

In Sample Number 1, the electro-conductive paste A was applied onto one side of the above-mentioned ceramic green sheet by screen printing method to form a thickness of 30 μm. Then, the ceramic green sheets were piled on each other so that a stacked body 7 was obtained. In the stacked body 7, the green sheets were stacked on each other so as to form 300 plies of the internal electrode layers 5 and at each ends of the stacked body 7 in the stacking direction, 20 plies of the ceramic green sheets, on which the electro-conductive paste was not applied, were piled on, respectively.

In Sample Numbers 2 to 8, the electro-conductive paste was applied to one side of the above-mentioned ceramic green sheet by screen printing method to form a thickness of 30 μm. In addition, on one side of the other above-mentioned ceramic green sheet, the ceramic paste was applied so as to form a thickness of 30 μm by screen printing method. In the Sample Numbers 2 and 3, the green sheet on which the ceramic paste was printed was located instead of the sheet on which the conductive paste was printed which serves as the internal electrode layers 5 at the 50th and 250th position of the layers in the stacking direction. In addition, stacking a plurality of the green sheets each on which the conductive paste was printed and a plurality of the green sheet each on which the ceramic paste was printed to prepare each stacked body 7, wherein in Sample Number 4, the green sheet comprising the ceramic paste was located at each of the 50th, the 100th, the 150th, the 200th, the 250th and the 300th positions in the stacking direction; and in Sample Numbers 5 to 9, the green sheet comprising the ceramic paste was located at each of the 1st, the 50th, the 100th, the 150th, the 200th, the 250th and the 300th positions in the stacking direction instead of the green sheet comprising the conductive paste for forming the internal electrode layer 5. In addition, in the Sample Numbers 5 to 9, the green sheets were stacked on each other so as to form 300 plies of the internal electrode layers 5 and at each ends of the stacked body 7 in the stacking direction, merely the ceramic green sheets were stacked to form 20 plies thereof, respectively, similar to Sample Number 1.

Then, each stacked body 7 of each Sample Number was subjected to a de-binder (i.e. binder removal) treatment, followed by calcined at a temperature from 800° C. to 1200° C. to obtain a calcined body, respectively. In this treatment, each of the stacked bodies 7 of the Sample Numbers 2 to 9 contained acrylic beads, which evaporates during the calcining treatment, and contained the sheets comprising the ceramic paste having a large particle size of PZT. Therefore, as shown in Table 1, the low-rigidity ceramic layer 15 having so high rate of void ratio, which is 80%, was produced.

Furthermore, in each of Sample Numbers 3 to 8, the calcined body was immersed in a solution, which was prepared by adding 1 ppm of dilute sulfuric acid as a gelation rate accelerating agent to an aqueous solution containing 10% of TEOS, and each sample in each container was evacuated to a pressure of at most $2*10^3$ Pa with a rotary pump. The reason why the container was evacuated was to make the low-rigidity ceramic layer 15 in each sample sufficiently absorb the solution. Thereafter, returning to an atmospheric pressure, followed by dried at a temperature of 80° C. for 1 hour.

In each of Sample Numbers 6 and 7, the calcined body was immersed in a solution, which was prepared by adding 1 ppm of dilute sulfuric acid as a gelation rate accelerating agent to an aqueous solution containing 10% of TEOS, and each sample in each container was evacuated to a pressure of at most 130 Pa with a rotary pump, thereafter returned to an atmospheric pressure, followed by dried at a temperature of 80° C. for 1 hour.

The calcined body of Sample Number 9 was immersed in an acetone solution containing 5% by mass of an epoxy resin (product name: AralditeLY-5052) and then accommodated in a container and evacuated to a pressure of at most $2*10^3$ Pa with a rotary pump so as to make each of the low-rigidity ceramic layers 15 sufficiently absorb the solution, thereafter returned to an atmospheric pressure, followed by dried at a temperature of 80° C. for 1 hour.

Then, each of the calcined body in each Sample Number was shaped to have a desired size and each external electrode 9 was formed thereon. To this end, a binder, a plasticizer, a glass powder and so forth were added to a metal powder, wherein silver is the main component, and mixed to produce an electro-conductive paste for the external electrode 9. This electro-conductive paste was applied to the determined portion for forming the external electrode 9 on the outer surface of the above calcined body by screen printing method. Then the calcined body was calcined at a temperature from 600 to 800° C., thereby the external electrode 9 was obtained.

In each of the calcined body of Sample Numbers 7 to 9, the calcined body was immersed in an acetone solution containing 5% by mass of an epoxy resin (product name: AralditeLY-5052) and then accommodated in a container and evacuated to a pressure of at most $2*10^3$ Pa with a rotary pump so as to make each of the low-rigidity ceramic layers sufficiently absorb the solution. Thereafter, the pressure was returned to an atmospheric pressure. The surface of the element 1 was washed with acetone to remove the resin component and dried at a temperature of 80° C. for one hour. The multi-layer piezoelectric element 1 was produced as mentioned above.

Two pieces of each multi-layer piezoelectric elements 1 were produced per each Sample Number. It was intended that one piece was used for the observation by a scanning electron microscope (SEM) and another piece was used for driving performance evaluation. The components of the electro-conductive paste used for producing the multi-layer piezoelectric element 1 of each Sample Number, the void ratio of the internal electrode layers 5 after calcination, and the shape of the low-rigidity ceramic layer 15 are shown in Table 1.

Here, the void ratio means the rate (%) of the area that the void 17 occupies to the cross-sectional area of the stacked body 7 in the cross section of the stacked body 7 perpendicular to or parallel to the stacked direction thereof. The void ratio was measured as follows.

First, the stacked body 7 was polished by a known polishing means so that a cross section, which is perpendicular to the stacked direction, is exposed. Specifically, the stacked body was polished by, for example, a table polishing machine KEMET-V-300 (available from Kemet Japan Co., Ltd.) as the polishing machine using a diamond paste. The cross section that was exposed by the above polishing treatment was observed, for example, under a scanning electron microscope (SEM), an optical microscope or a metallurgical microscope, and thereby each image of each cross section was obtained. These image of the cross section was subjected to an image processing, so that the void ratio of each sample was determined.

TABLE 1

| | internal electrode | | | low-rigidity ceramic layer | |
|---|---|---|---|---|---|
| Sample No. | metal composition in printed paste | metal composition after calcined | void ratio (%) | void ratio (%) | form |
| 1 | Ag 95% Pd 5% | Ag 95% Pd 5% | 25 | — | — |
| 2 | Ag 95% Pd 5% | Ag 96% Pd 4% | 25 | 80 | — |
| 3 | Ag 95% Pd 5% | Ag 96% Pd 4% | 25 | 80 | FIG. 4 |
| 4 | Ag 95% Pd 5% | Ag 96% Pd 4% | 25 | 80 | FIG. 4 |
| 5 | Ag 95% Pd 5% | Ag 96% Pd 4% | 25 | 80 | FIG. 4 |
| 6 | Ag 95% Pd 5% | Ag 96% Pd 4% | 25 | 80 | FIG. 7 |
| 7 | Ag 95% Pd 5% | Ag 96% Pd 4% | 25 | 80 | FIG. 10 |
| 8 | Ag 95% Pd 5% | Ag 96% Pd 4% | 25 | 80 | FIG. 9 |
| 9 | Ag 95% Pd 5% | Ag 96% Pd 4% | 25 | 80 | FIG. 4 |

As shown in Table 1, as for the multi-layer piezoelectric element 1 of the Sample Number 1, the low-rigidity ceramic layers 15 were not formed. On the other hand, in each of the multi-layer piezoelectric element 1 of the Sample Numbers 2 to 9, the low-rigidity ceramic layer 15 equipped with the ceramic portions 19 which are located apart from each other via a void 17 and the covering layer 21 which covers at least a part of the outer surface of the ceramic portion 19 was produced. Accordingly, the void ratio of the low-rigidity ceramic layer 15 was 80% compared with the void ratio of the internal electrode layers 5 being 15%. Thus, it is observed that a low-rigidity ceramic layer 15 having a low rigidity compared with the internal electrode layers 5 and the piezoelectric layer 13 was produced. As a result of the observation by SEM, in Sample Numbers 3 to 5, the covering layer 21 which consists of a vitreous substance of $SiO_2$ was formed in a part of the plurality of ceramic portions 19. It was because a Si oxide in TEOS had deposited on the surface of the ceramic portion 19 as a vitreous substance after it was gelled. Moreover, in addition to the covering layer 21 which consists of a vitreous substance of above-mentioned $SiO_2$, the covering layer 21 which consists of glass of a Pb—Si—O component to which the Pb component of PZT and $SiO_2$ reacted was formed in a part of two or more ceramic portions 19.

In the Sample Number 6, as shown in FIG. 7, the covering layer 21 which consists of a vitreous substance of $SiO_2$ was formed in two or more ceramic portions 19 and a part of piezoelectric layer 13. Moreover, in addition to the covering layer 21 which consists of a vitreous body of above-mentioned $SiO_2$, the covering layer 21 which consists of glass of a Pb—Si—O component to which the Pb component of PZT and $SiO_2$ reacted was formed in two or more ceramic portions 19 and a part of piezoelectric layer 13.

In the Sample Number 7, as shown in FIG. 10, the covering layer **21*a* which consists of a vitreous body of $SiO_2$ was formed in two or more ceramic portions 19 and a part of piezoelectric layer 13. Moreover, the covering layer 21*b* which consists of epoxy resins was formed in the surface of the covering layer 21*a* which consists of a vitreous body of $SiO_2$. Thus, in the Sample Numbers 6 and 7, the covering layer 21 which consists of a vitreous body of $SiO_2$ was able to be formed in a part of piezoelectric layer 13** by immersing the calcined body in the solution containing the above-mentioned TEOS.

In the Sample Number 8, as shown in FIG. 9, the covering layer **21*a* which consists of a vitreous body of $SiO_2$, and the covering layer 21*b* which consists of epoxy resins were formed in a part of two or more ceramic portions 19**.

In Sample Number 9, as shown in FIG. 4, the covering layer 21 which consists of the epoxy resins was formed in a part of the plurality of metal parts 19.

Next, drive evaluation was performed. As the drive evaluation, the high speed response property and the durability were evaluated. First, each lead was connected to each external electrode 9, direct current electric field of 3 kV/ram was applied between the external electrodes 9 (anode and cathode) via the leads for 15 minutes to perform the polarization treatment. Thereby, each piezoelectric actuator using the multi-layer piezoelectric element 1 in each sample was produced. Applying a direct current voltage of 170V to the obtained multi-layer piezoelectric element 1, the amount of the displacement at the initial state was measured. As a result, the piezoelectric actuator of Sample Number 1 showed 45 μm, and the piezoelectric actuator of Sample Numbers 2 to 9 showed 40 μm, respectively. The reason why the amount of the displacement in the piezoelectric actuator of Sample Number 1 is larger than that of the other actuators of Sample Numbers 2 to 9 is that the low-rigidity ceramic layer 15 did not act as the piezoelectric layer 13 in the multi-layer piezoelectric element 1 in Sample Numbers 2 to 9.

In the evaluation of high speed response property, AC voltage of 0 to +170V was applied to each piezoelectric actuator at the room temperature with gradually increasing the frequency from 150 Hz. In the evaluation of the durability, AC voltage of 0 to +170V was applied to each piezoelectric actuator at the room temperature with the frequency of 150 Hz in one cycle and the cycle was continuously repeated for $1*10^7$ times. The results are shown in Table 2.

TABLE 2

| Sample No. | initial displacement amount (μm) | displacement amount after 1 * $10^7$ cycles (μm) | noise of higher harmonic wave | beat note at frequency over 1 kHz | peeling at multi-layer after continuous drive (1 * $10^9$ cycles) | crack in low-rigidity ceramic layer |
|---|---|---|---|---|---|---|
| 1 | 45 | 5 | formed | formed | found | — |
| 2 | 45 | 10 | formed | formed | found | found |
| 3 | 40 | 37 | not formed | not formed | not found | not found |
| 4 | 40 | 38 | not formed | not formed | not found | not found |
| 5 | 40 | 39 | not formed | not formed | not found | not found |
| 6 | 40 | 39 | not formed | not formed | not found | not found |
| 7 | 40 | 40 | not formed | not formed | not found | not found |
| 8 | 40 | 39 | not formed | not formed | not found | not found |

As shown in Table 2, after the evaluation of high speed response property under a low pressure environment, the piezoelectric actuator of Sample Number 1 started to produce a beat note when the frequency exceeded 1 kHz as a result of the response property evaluation in the atmosphere. The reason why the above phenomenon arose is the multi-layer piezoelectric element 1 of Sample Number 1 was not provided with the low-rigidity ceramic layer 15, so that the constraining force of the internal electrode layer 5 to the piezoelectric layer 13 was so large. It is considered that the constraining force to the piezoelectric layer 13 was so large that the high speed response property thereof was inhibited. As a result, the multi-layer piezoelectric element 1 failed to follow the applied frequency of the AC voltage.

After high speed response property evaluation under low pressure environment, the piezoelectric actuator of the Sample Number 2 started to produce a beat note when the frequency exceeded 1 kHz as a result of the response property evaluation in the atmosphere. As a result of observing by SEM, the ceramic portion 19 of the low-rigidity ceramic layers 15 changed to black color and fractured, and a part of the piezoelectric layer 13 which is adjacent to the low-rigidity ceramic layers 15 was changed to black color and the crack had extended. It is because the above-mentioned continued drive evaluation was performed under a low pressure environment, so that the reduction reaction was facilitated also in the piezoelectric layer 13 which is adjacent to the low-rigidity ceramic layers 15. As a result, it seems that the high speed response property of the element decreased so that it failed to follow the applied frequency of the AC voltage.

In addition, in order to check the driving frequency, each of the pulse shape of the piezoelectric actuator of Sample Numbers 1 and 2 was checked using an oscilloscope DL1640L (available from Yokogawa Electric Corporation). As a result, a higher harmonic wave noise was found at the position which corresponds to the integral multiple of the drive frequency.

As shown in Table 2, as a result of durability evaluation, in each of the piezoelectric actuator of Sample Numbers 1 and 2, the amount of the displacement after the evaluation test was 5 μm, which was decreased by nearly 50% compared with that of before the evaluation test. In each of the piezoelectric actuator of Sample Numbers 1 and 2, peeling of a part of the multi-layer piezoelectric element 1 was found.

On the other hand, in each of the piezoelectric actuator of Sample Numbers 3 to 9, no peeling was found and the amount of the displacement after the evaluation test was in a range from 35 to 40 μm, thus the amount of the decreased displacement was remained within 10% or less. In particular, in each of the piezoelectric actuators of Sample Numbers 7 and 8, it was found that the decreasing amount of the displacement was hardly seen, and it had very high durability.

The invention claimed is:

1. A multi-layer piezoelectric element, comprising:

a layered body comprising a plurality of ceramic layers and a plurality of internal electrode layers, each of the plurality of internal electrode layers being sandwiched between ceramic layers of the plurality of ceramic layers that are located opposite to each other, wherein the plurality of ceramic layers comprises a plurality of piezoelectric layers, and a low-rigidity ceramic layer which has a rigidity lower than that of the plurality of piezoelectric layers and that of the plurality of internal electrode layers, and wherein the low-rigidity ceramic layer comprises a plurality of ceramic portions which are apart from each other via a void, and a covering layer which covers at least a part of an outer surface of the plurality of ceramic portions.

2. The multi-layer piezoelectric element according to claim 1, wherein one surface of the low-rigidity ceramic layer contacts with one of the plurality of piezoelectric layers.

3. The multi-layer piezoelectric element according to claim 1, wherein each of both surfaces of the low-rigidity ceramic layer contacts with one of the plurality of piezoelectric layers.

4. The multi-layer piezoelectric element according to claim 2, wherein at least a part of the covering layer is bonded to one of the plurality of piezoelectric layers which is adjacent thereto in a stacked direction.

5. The multi-layer piezoelectric element according to claim 3, wherein at least a part of the covering layer is bonded to one of the plurality of piezoelectric layers which is adjacent thereto in a stacked direction.

6. The multi-layer piezoelectric element according to claim 2, wherein at least one of the plurality of ceramic portions is bonded to one of the plurality of piezoelectric layers which is adjacent thereto via the covering layer.

7. The multi-layer piezoelectric element according to claim 3, wherein at least one of the plurality of ceramic portions is bonded to one of the plurality of piezoelectric layers which is adjacent thereto via the covering layer.

8. The multi-layer piezoelectric element according to claim 1, wherein at least one of the plurality of ceramic portions has a surface which is partially exposed.

9. The multi-layer piezoelectric element according to claim 8, wherein the at least one of the plurality of ceramic portions has the surface which is covered by the covering layer in a plurality, the covering layer in the plurality being apart from each other.

10. The multi-layer piezoelectric element according to claim 8, wherein the surface of the at least one of the plurality of ceramic portions has a plurality of areas which are exposed and apart from each other.

11. The multi-layer piezoelectric element according to claim 10, wherein the covering layer has a mesh shape, and the plurality of areas of the surface of the at least one of the plurality of ceramic portions are apart from each other and are exposed through the covering layer.

12. The multi-layer piezoelectric element according to claim 1, wherein at least one of the plurality of ceramic portions has a surface, a whole area of the surface being covered by the covering layer.

13. The multi-layer piezoelectric element according to claim 1, wherein the covering layer comprises a glass component as a main component.

14. The multi-layer piezoelectric element according to claim 1, wherein the covering layer comprises a main component of the plurality of ceramic portions.

15. The multi-layer piezoelectric element according to claim 1, wherein the covering layer comprises a plurality of layers.

16. The multi-layer piezoelectric element according to claim 15, wherein the covering layer comprises the plurality of layers having different contents of a main component of the plurality of ceramic portions each other.

17. The multi-layer piezoelectric element according to claim 15, wherein the covering layer comprises the plurality of layers having different modulus of elasticity each other.

18. An injection apparatus, comprising:

the multi-layer piezoelectric element according to claim 1; and an injection hole, wherein the injection hole is configured to inject a liquid by the operation of the multi-layer piezoelectric element.

19. A fuel injection system, comprising:

a common rail configured to store a high-pressure fuel;

the injection apparatus according to claim 18 configured to discharge the high-pressure fuel stored in the common rail; and an injection control system configured to send a drive signal to the injection apparatus.

* * * * *